(12) United States Patent
Oh

(10) Patent No.: US 11,742,370 B2
(45) Date of Patent: Aug. 29, 2023

(54) TIME-OF-FLIGHT PIXEL WITH VERTICAL PHOTOGATES

(71) Applicant: Microsoft Technology Licensing, LLC, Redmond, WA (US)

(72) Inventor: Minseok Oh, San Jose, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 205 days.

(21) Appl. No.: 16/884,342

(22) Filed: May 27, 2020

(65) Prior Publication Data
US 2021/0377472 A1 Dec. 2, 2021

(51) Int. Cl.
*H01L 27/146* (2006.01)
*H04N 25/76* (2023.01)
(Continued)

(52) U.S. Cl.
CPC ...... *H01L 27/14614* (2013.01); *G01S 7/4863* (2013.01); *G01S 7/4865* (2013.01);
(Continued)

(58) Field of Classification Search
CPC ........ H04N 5/374; H04N 5/378; H04N 25/75; H04N 25/76; G01S 7/4914; G01S 7/4915; G01S 7/4863; G01S 7/4865; G01S 17/36; G01S 17/894; H01L 27/14603; H01L 27/14614; H01L 27/14623; H01L 27/14627; H01L 27/1463; H01L 27/1464; H01L 31/028
See application file for complete search history.

(56) References Cited

U.S. PATENT DOCUMENTS

| 7,626,685 | B2 * | 12/2009 | Jin | G01S 17/89 257/290 |
| 7,671,391 | B2 * | 3/2010 | Kawahito | G01S 17/894 257/E31.124 |
| 8,384,007 | B2 | 2/2013 | Yu et al. | |
| 9,343,607 | B2 | 5/2016 | Buettgen et al. | |

(Continued)

OTHER PUBLICATIONS

"International Search Report and Written Opinion issued in PCT Application No. PCT/US21/023376", dated Jun. 24, 2021, 14 Pages.

Jayasuriya, Suren, "Plenoptic Imaging and Vision Using Angle Sensitive Pixels", In Dissertation of Cornell University, Jan. 30, 2017, 182 Pages.

(Continued)

*Primary Examiner* — Lin Ye
*Assistant Examiner* — Chriss S Yoder, III
(74) *Attorney, Agent, or Firm* — Alleman Hall Creasman & Tuttle LLP

(57) ABSTRACT

Examples are disclosed that relate to time-of-flight camera systems comprising vertical photogates. One example provides a time-of-flight camera comprising a plurality of addressable pixels configured for backside illumination, each addressable pixel comprising a first vertical photogate and a second vertical photogate. The time-of-flight camera further comprises a processor and a storage device storing instructions executable on the processor to, during an integration period, apply a first relative bias to the first vertical photogate and the second vertical photogate to collect charge at a first pixel tap, apply a second relative bias to the first vertical photogate and the second vertical photogate to collect charge at a second pixel tap, and determine a distance value for the addressable pixel based at least upon the charge collected at the first pixel tap and the charge collected at the second pixel tap.

19 Claims, 9 Drawing Sheets

(51) Int. Cl.
    *G01S 7/4863*     (2020.01)
    *G01S 7/4915*     (2020.01)
    *H01L 31/028*     (2006.01)
    *G01S 7/4865*     (2020.01)
    *G01S 7/4914*     (2020.01)
    *H04N 25/75*     (2023.01)

(52) U.S. Cl.
    CPC .......... *G01S 7/4914* (2013.01); *G01S 7/4915* (2013.01); *H01L 27/1463* (2013.01); *H01L 27/1464* (2013.01); *H01L 27/14603* (2013.01); *H01L 27/14627* (2013.01); *H01L 31/028* (2013.01); *H04N 25/75* (2023.01); *H04N 25/76* (2023.01)

(56) References Cited

U.S. PATENT DOCUMENTS

| | | |
|---|---|---|
| 2009/0244514 A1 | 10/2009 | Jin et al. |
| 2011/0037969 A1 | 2/2011 | Spickermann et al. |
| 2011/0198481 A1 | 8/2011 | Kim et al. |
| 2016/0225812 A1 | 8/2016 | Elkhatib et al. |
| 2019/0214428 A1 | 7/2019 | Nagaraja et al. |
| 2019/0339392 A1 | 11/2019 | Manabe et al. |
| 2020/0185439 A1* | 6/2020 | Jin ..................... G11C 11/5607 |

OTHER PUBLICATIONS

Spickermann, et al., "Pulsed Time-of-Flight 3D-CMOS Imaging Using Photogate-Based Active Pixel Sensors", In Proceedings of ESSCIRC, Sep. 14, 2009, 4 Pages.

* cited by examiner

TIME-OF-FLIGHT PIXEL WITH VERTICAL PHOTOGATES

BACKGROUND

Many computing applications use controllers, remotes, keyboards, mice, or other input devices to allow a user to interact with the application. More recently, some computing applications such as computer games and multimedia applications increasingly employ depth cameras to capture motion and body movement of a user, enabling the user to interact with the application via natural gestures. Some such depth cameras are time-of-flight (ToF) cameras, which determine depth by measuring the round-trip travel time for light between the camera and an object. For example, a temporally-modulated light signal may illuminate the object while the ToF camera captures the reflected, phase-shifted signal from which depth is calculated.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to time-of-flight camera systems employing vertical photogates. One example provides a time-of-flight camera comprising a plurality of addressable pixels configured for backside illumination, each addressable pixel comprising a first vertical photogate and a second vertical photogate. The time-of-flight camera further comprises a processor and a storage device storing instructions executable on the processor to, during an integration period, apply a first relative bias to the first vertical photogate and the second vertical photogate to collect charge at a first pixel tap, apply a second relative bias to the first vertical photogate and the second vertical photogate to collect charge at a second pixel tap, and determine a distance value for the addressable pixel based at least upon the charge collected at the first pixel tap and the charge collected at the second pixel tap.

DETAILED DESCRIPTION

A time-of-flight (ToF) camera may determine, for each addressable pixel of an image sensor of the camera, a depth of a subject (a distance from the subject to the pixel) based on a phase of a received light signal that is temporally modulated by a time-of-flight illuminator. The depth values determined for each addressable pixel of the camera image sensor are used to create a depth image, which may be used, for example, to identify motion (e.g. gestures) of a subject.

The received light signal generates photoelectrons in a region of the pixel, thereby producing an electric charge signal. A ToF sensor may be able to modulate the pixel response in synchronization with a modulated illumination source to direct the charge to different taps of the pixel during an integration period. A global shutter mechanism may be used to simultaneously modulate the entire pixel array. Data is sampled at a plurality of different phases of the temporally modulated light signal, and a depth value for a pixel is determined using the signals acquired for each pixel tap at each illumination phase that is sampled.

Current ToF pixels may employ planar photogates to collect charge during integration. Planar photogates are photogates that have a major dimension that is oriented generally parallel to a surface of the pixel at which light enter the pixel. However, pixels with planar photogates may suffer from various problems. For example, one method to increase a quantum efficiency (QE) of a pixel is to increase a depth of a photoelectron generation region of a pixel, which refers to a region in which electrons are generated from light incident on the pixel. However, increasing a thickness of the photoelectron generation region also increases an average distance that generated electrons travel to reach the photogate. This may lead to relatively longer photoelectron transit times and a reduction in signal contrast between taps (demodulation contrast). These effects may be mitigated by using higher photogate voltages, but this also may cause higher power consumption. Further, planar photogates may occupy a relatively large area in a sensor array, potentially limiting the resolution of a ToF camera.

Accordingly, examples are disclosed that may address the above-described issues. Briefly, the disclosed examples utilize vertical photogates, which may have a spacing that is not a function of thickness of the photoelectron generation region. Thus, vertical photogates may allow a relatively thicker photoelectron generation region to be used to increase QE without a corresponding increase in electron migration distances and transit times. Further, in some examples, a negative bias may be applied to one of the vertical photogates, which may help suppress dark current noise. Additionally, pixels utilizing vertical photogates may be placed closer together than pixels with planar photogates, which may facilitate increasing a resolution of a ToF camera design.

Figure 1:
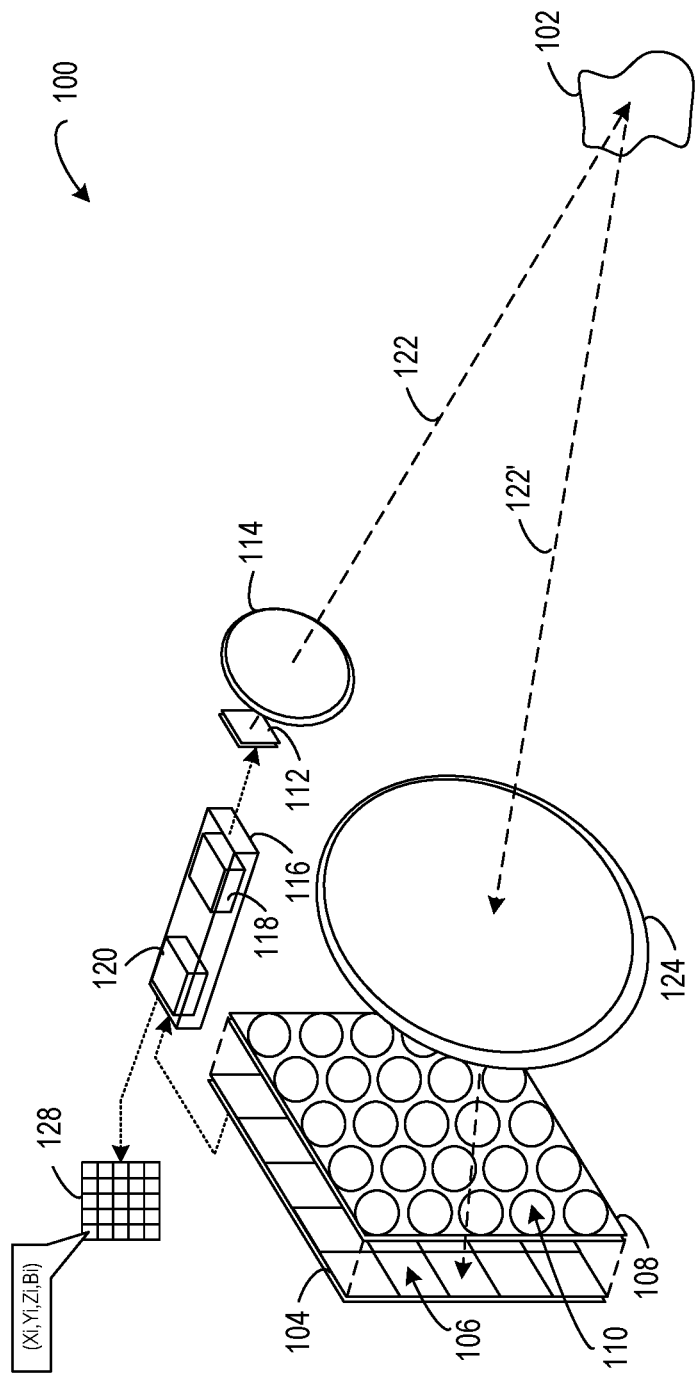
FIG. 1 is an exploded, schematic view showing aspects of an example time-of-flight (ToF) camera.

FIG. 1 shows aspects of an example ToF camera 100 configured to operate in such a manner. The term 'camera' refers herein to any imaging component having at least one optical aperture and sensor array configured to image a scene or subject 102. Camera 100 includes a sensor array 104 of individually addressable pixels 106. Each pixel 106 may further include a plurality of pixel taps, or detection units that each detects samples. In some implementations, the pixels may be complementary metal-oxide semiconductor (CMOS) elements, but other suitable architectures are also envisaged. Each pixel may be responsive to light over a broad wavelength band, although this is not required. For silicon-based pixels, the wavelength response may range from 300 to 1100 nm, for example. For germanium-based pixels, the wavelength response may range from 800 to 1700 nm, for example. Sensor array 104 is schematically illustrated with twenty-five individually addressable pixels 106 for simplicity, although any suitable number of pixels 106 may be used.

Microlens array 108 optionally may be arranged directly over sensor array 104. Microlens array 108 includes a plurality of microlens elements 110. Each microlens element 110 of microlens array 108 may be registered to a pixel 106 of the sensor array 104. When included, microlens array 108 may provide a larger effective fill factor at each of the pixels, for increased collection efficiency and reduced cross-talk between pixels.

A ToF illuminator 112 is configured to emit active IR light to illuminate the subject 102. In one example, the ToF illuminator 112 includes an IR laser configured to emit IR light. In some examples, the ToF illuminator 112 optionally may include a diffuser 114 covering a field of illumination of the ToF illuminator 112. Depth measurements may be taken using IR light, including near infrared (NIR) light, far infrared (FIR) light, or any other suitable wavelength. Although not shown in FIG. 1, the camera optionally may include a bandpass filter to limit the portion of the electromagnetic spectrum reaching the pixels 106 to the portion of the electromagnetic spectrum emitted by the ToF illuminator 112.

Electronic controller 116 may include a logic machine and associated storage machine. The storage machine may hold instructions that cause the logic machine to enact any operation, algorithm, computation, or transformation disclosed herein. In some implementations, the logic machine may take the form of an application-specific integrated circuit (ASIC) or system-on-a-chip (SoC), in which some or all of the instructions are hardware- or firmware-encoded. Electronic controller 116 includes a ToF controller machine 118 and an output machine 120 that may be operatively connected to the sensor array 104 and/or the ToF illuminator 112. Machines 118 and 120 may be implemented as separate physical hardware and/or firmware components or incorporated into a single hardware and/or firmware component.

The ToF controller machine 118 is configured to repeatedly activate the ToF illuminator 112 and synchronously address the pixels 106 of sensor array 104 to acquire IR images. The active light signal emitted from the ToF illuminator 116 may be temporally modulated in different modulation frequencies for different IR image captures. In the illustrated example, the ToF controller machine 118 activates the ToF illuminator 112 to illuminate the subject 102 with active IR light 122 and addresses the pixels 106 of sensor array 104 in synchronicity. IR light 122' reflects from the subject 102 back to the camera 100. The reflected IR light 122' passes through receiving optics 124 and is incident on the pixels 106 of the sensor array 104 to provide a measurement. For example, the measurement may be an intensity measurement of active IR light back-reflected from the subject to the pixel. In the illustrated example, IR light 122' is measured by a pixel 106 of sensor array 104, thus providing phase information useable with the knowledge of the camera's configuration to determine the world space position of a locus of subject 102.

The ToF controller machine 118 is configured to generate a depth image 128 based on a plurality of captured IR images. The term 'depth image' refers to an array of individually addressable image pixels registered to corresponding regions $(X_i, Y_i)$ of an imaged scene, with a depth value $Z_i$ indicating, for each image pixel, the depth of the corresponding region. 'Depth' is defined as a coordinate parallel to the optical axis of the camera, which increases with increasing distance from the camera. The term 'depth video' refers herein to a time-resolved sequence of depth images. The output machine 120 is configured to output the depth image 128 generated by the ToF controller machine 118. The output machine 120 may be configured to output the depth image 128 in any suitable form. In some examples, the output machine 120 may output the depth image 128 as a data structure in which each element of the matrix corresponds to a different pixel.

The depth or distance value for a pixel is calculated based on the phase shift of the incident back-reflected light. The quality of the depth determination may depend on the quantum efficiency (QE) of the image sensor, defined as the number of electrons generated per incident photon, and on the signal contrast between the taps, also known as demodulation contrast. Current ToF pixels may utilize planar photogates for QE demodulation. However, planar photogates occupy a large pixel area. Additionally, a sensor with planar photogates may include potential barriers placed between pixels, leading to pixels placed even further apart. Combined, these drawbacks may pose limits on camera resolution.

The use of a thicker epitaxial silicon layer (EPI) may help to increase QE for NIR or short-wave infrared (SWIR) compared to the use of a thinner EPI layer. However, the use of a thicker EPI in turn may also result in the use of a relatively higher bias voltage applied to the planar photogates in order to extend the electric field up through the EPI to preserve demodulation contrast, which leads to higher power consumption. This is at least due to generated photoelectrons being farther from the taps in a thicker EPI layer. The electrons may not diffuse sufficiently quickly during integration of one tap where a lower voltage is applied to a photogate, and ultimately be collected at a different tap upon change of potential bias.

Accordingly, examples are disclosed that relate to a ToF image pixel comprising vertical photogates. Compared to a pixel of comparable geometry that uses planar photogates, the disclosed examples may provide lower power consumption, better shutter efficiency, and higher demodulation contrast for pixels with relatively thicker EPI layers. This may help to achieve smaller pixel pitches, and thus higher resolution imaging. The vertical photogate design further may yield relatively higher quantum efficiency without loss of contrast, as a thicker EPI layer may be used without a corresponding higher photogate voltage. In some examples, when one vertical photogate is biased at a positive voltage, the other vertical photogate may be biased at negative voltage, which may help to further improve the demodulation contrast. Also, while a vertical photogate may lead to higher dark current than planar photogates, ToF demodulation contrast may be less sensitive to dark current than RGB image sensors. As such, any disadvantage from higher dark current may be mitigated by lower power operation and better modulation contrast arising from the vertical photogates. Further still, as the vertical photogate may extend most of the way through the epi-thickness, the use of a vertical photogate may help to prevent photoelectron leakage to adjacent storage nodes, thus improving shutter efficiency.

Figure 2:
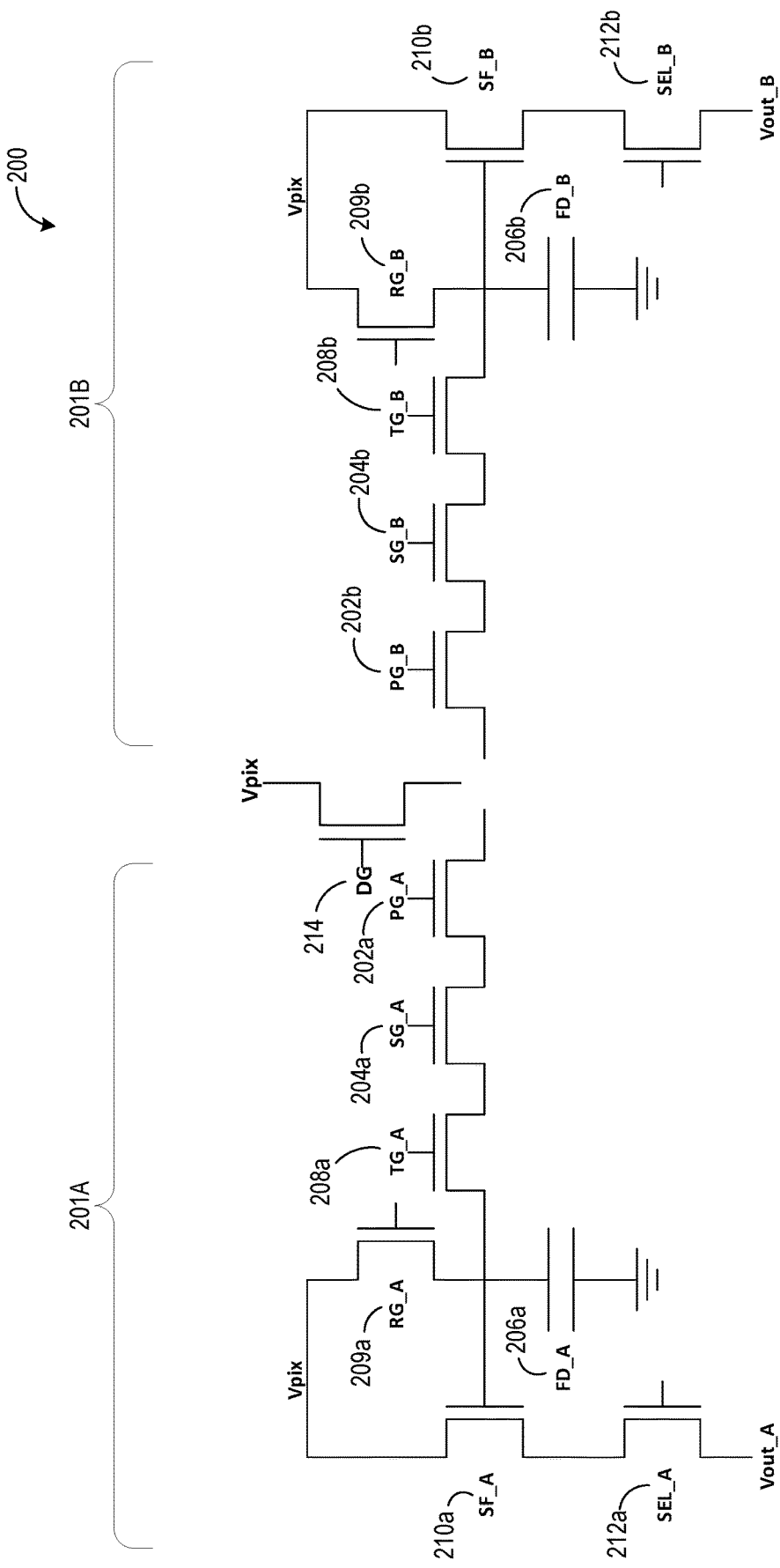
FIG. 2 schematically shows an electrical schematic of an example time-of-flight pixel comprising vertical photogates.

FIG. 2 schematically shows an electrical schematic diagram of example individually addressable ToF pixel 200 for a ToF camera in accordance with the present disclosure. ToF pixel 200 includes two pixel taps, indicated here as tap 201A and tap 201B via a and b labels on the illustrated components. In other examples, a ToF pixel may include any other suitable number of taps. Each pixel tap includes a photogate 202a, 202b configured to accumulate charge during an integration period. During an integration period, photogates PG_A 202a and PG_B 202b are modulated out of phase from each other. Each pixel tap also includes a storage gate 204a, 204b configured to receive and store charge that is accumulated at the corresponding photogate 202a, 202b during the integration period. After integration and during readout, charge stored on the storage gates 204a, 204b is transferred to a floating diffusion (FD) capacitor 206a, 206b for a corresponding pixel tap (FD_A and FD_B) via operation of a transfer gate 208a, 208b for each tap. Charge on each FD capacitor 206a, 206b is read as a voltage across a source follower 210a, 210b, thereby providing a signal for that pixel tap. The controller then drains the first portion of charge via a reset gate 209a, 209b (RG_A, RG_B). The ToF pixel 200 further includes a selection gate 212a, 212b operable to select a tap for readout, and a drain gate 214 (DG) that is held low during integration and high during readout. In other examples, the drain gate 214 may be omitted.

Figure 3:
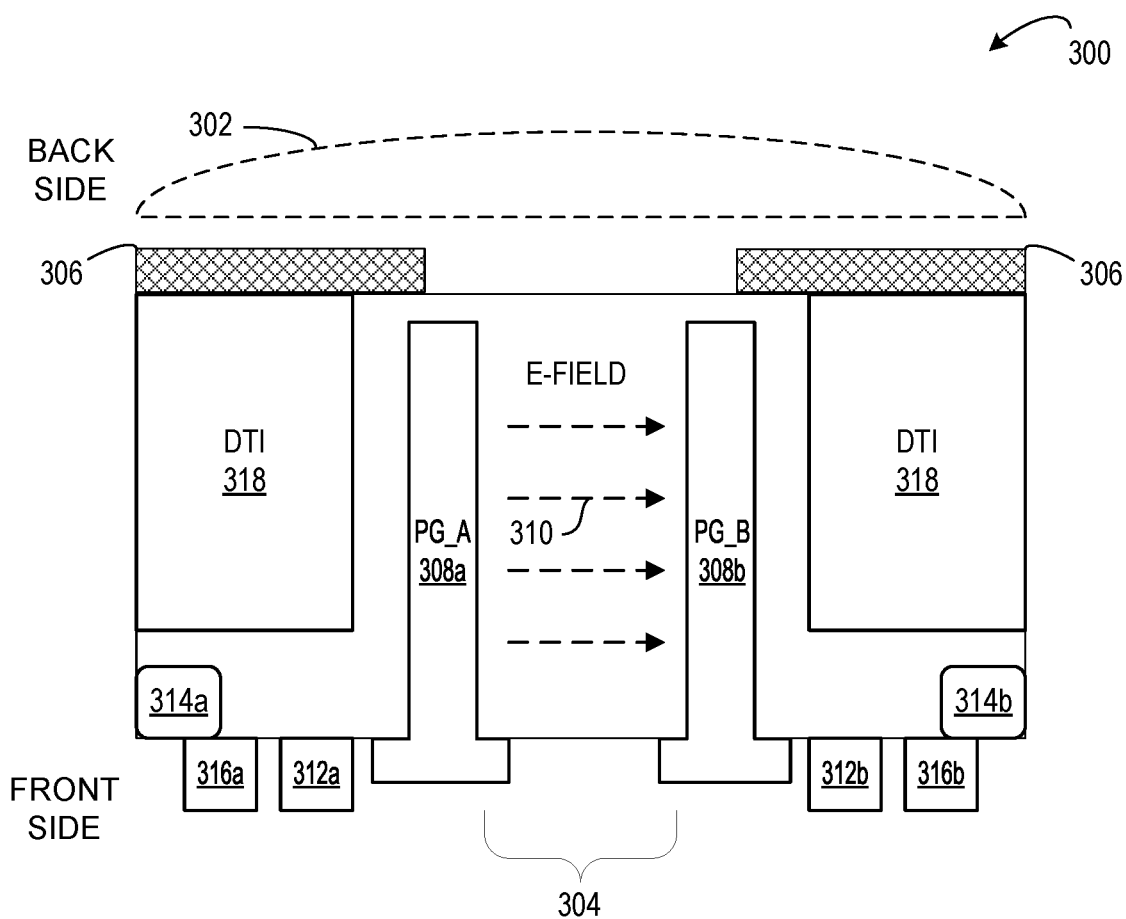
FIG. 3 shows a sectional view of an example ToF pixel comprising a storage gate.

FIG. 3 shows a cross sectional view of an example ToF pixel 300 configured for backside illumination. Pixel 300 is an example implementation of pixel 200 of FIG. 2. Light incident on the pixel is focused by a microlens 302 onto the pixel area to generate photoelectrons within a photoelectron generation region 304, which may comprise an EPI layer. In some examples, a metal shield 306 or other suitable structure may be formed on the backside configured with openings to allow light into the pixel area while blocking light from entering other areas of the structure. Photogate 308a (PG_A) and photogate 308b (PG_B) are spaced apart with the photoelectron generation region 304 therebetween. Incident photons may generate photoelectrons in the photoelectron generation region between PG_A and PG_B. Generated photoelectrons may flow to either of the photogates 308a, 308b depending on the applied electric field 310. Electric charge accumulated at PG_A 308a or PG_B 308b is transferred to the associated storage gate 312a (SG_A) or storage gate 312b (SG_B), respectively. After integration and during readout, charge stored on the storage gates 312a, 312b is transferred to a FD capacitor 314a, 314b for a corresponding pixel tap via operation of a transfer gate 316a, 316b for each tap. Charge on each FD capacitor 314a, 314b is read as a voltage across a source follower, thereby providing a signal for that pixel tap.

The pixel may comprise an EPI layer of sufficient thickness to achieve a desired QE. In some examples, the EPI region may be 3 µm thick. In such an example, vertical photogates 308a, 308b extend most of the way towards the back side of the bulk region. In one example, where the bulk region is 3.0 µm thick, the vertical photogates may comprise a length of 2.5 µm, for example. In other examples, the EPI region may have any other suitable thickness, and vertical photogates may have any other suitable length. For example, the vertical photogates may comprise a length that is 50% to 95% of a thickness of the EPI region. Photogates with lengths in this range may help to prevent photoelectron leakage to other pixels. In some such examples, the vertical photogates may comprise a length that is 70% to 95% of a thickness of the EPI region, thereby helping to provide additional protection against photoelectron leakage. Further, in some such examples, the vertical photogates may comprise a length that is 75% to 95% of a thickness of the EPI region. Further, in some examples, a distance between vertical photogates is shorter than a thickness of an EPI layer or other photoelectron-generating region of a pixel. This may help to preserve modulation contrast compared to the use of planar photogates with a similar thickness pixel and a similar bias applied used to collect charge at the photogates.

As mentioned above, the use of vertical photogates allows a relatively thicker EPI layer to be used without using a corresponding increase in photogate voltage, as a spacing of the vertical photogates is not a function of EPI layer thickness. Thus, ToF pixels with vertical photogates may require a relatively lower bias and a relatively lower voltage swing compared to ToF pixels with planar photogates of a similar EPI thickness. Lower voltage swings may result in lower power consumption for the sensor array. Furthermore, since the spacing between PG_A and PG_B is not a function of increasing EPI thickness, the transit distance and transit time for photoelectrons are not affected by the thickness of the EPI layer. Thus, a demodulation contrast can be maintained without increasing a photogate bias, even as a thickness of an EPI layer increases. The use of a vertical photogate also may block light and photoelectron leakage into the storage gate, further improving shutter efficiency.

Continuing with FIG. 3, deep trench isolation regions 318 (DTI regions) may be positioned between pixels. The DTI regions 318 may comprise an oxide or other suitable insulating material, and may help to prevent both photoelectron generation and photoelectron leakage between adjacent pixels.

As mentioned above, the use of vertical photogates may allow for a relatively smaller pixel pitch than a pixel with planar photogates. For example, a ToF pixel with vertical photogates may have a pitch within a range of 1-3 µm in some examples. A sensor array comprising many such pixels may have pixel spacing on the order of the pixel dimensions. In comparison, a comparable planar photogate pixel may have a pitch of 3 µm to 30 µm. A smaller pitch may be difficult to achieve using planar photogates, as it may be difficult to fit planar photogates in a pixel along with the other in-pixel transistors. The relatively smaller pixel pitch and closer spacing that vertical photogates may provide in a depth camera pixel compared to planar photogates thus may facilitate the design and manufacture of higher resolution depth cameras compared to planar photogates.

The use of vertical photogates also may allow a positive bias to be applied to PG_A 308a and a negative bias to be applied to PG_B 308b for integration of pixel tap A, and then reversed for integration of pixel tap B. This may increase the applied electric field 310 relative to holding one photogate at ground while applying a bias to the other. Furthermore, hole accumulation may occur near the negatively biased photogate. Hole accumulation can suppress dark current by recombination with dark current electrons, thereby helping to lower noise and further increase demodulation contrast.

Figure 4:
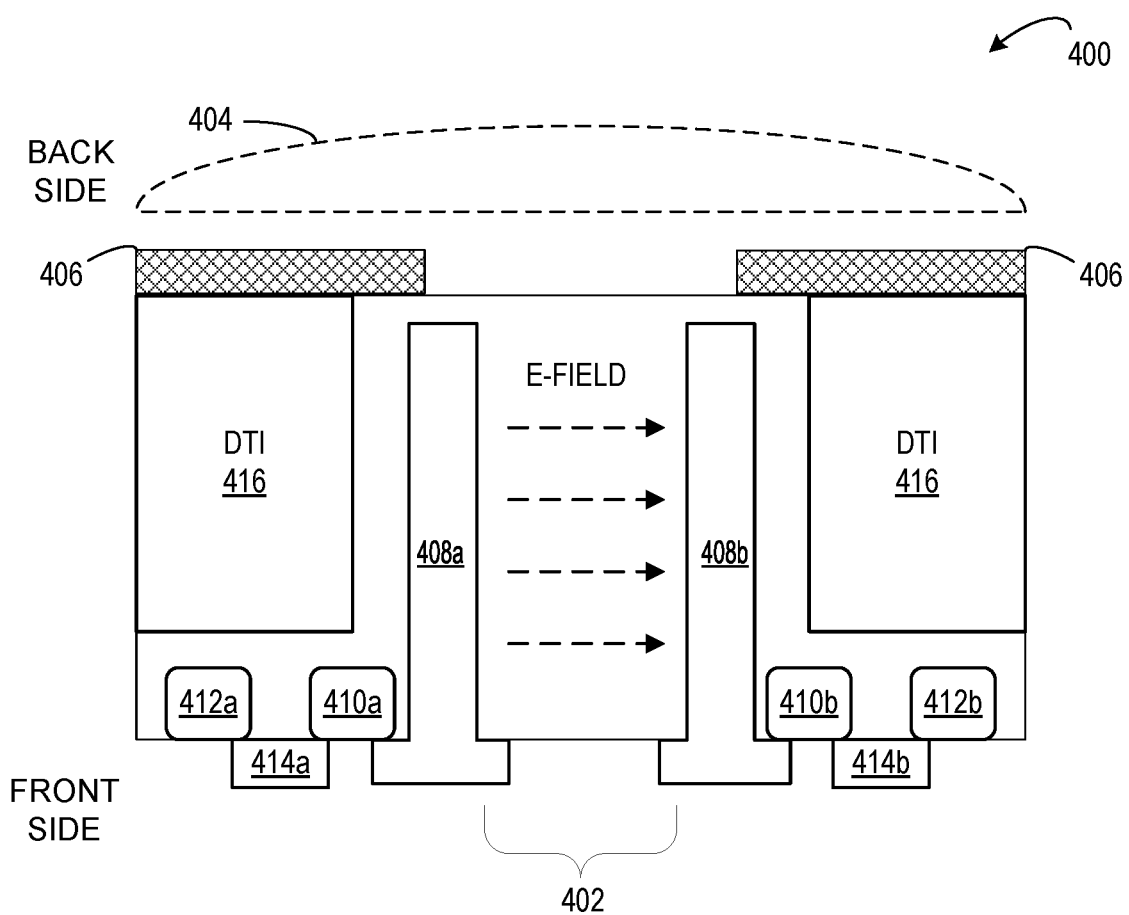
FIG. 4 shows a sectional view of an example ToF pixel comprising a storage diode.

FIG. 4 shows a cross sectional view of another example individually addressable ToF pixel 400 configured for backside illumination. Instead of the storage gates of pixels 200 and 300, pixel 400 comprises storage diodes. Similar to ToF pixel 300, ToF pixel 400 comprises a microlens 404 configured to focus incident light onto the pixel area to generate photoelectrons within a photoelectron generation region 402, and may comprise a metal shield 406 or other suitable structure to selectively allow light into the pixel while preventing light from entering other regions. Vertical photogate 408a and vertical photogate 408b are spaced apart with the photoelectron generation region therebetween. Generated photoelectrons flow to either of the vertical photogates 408a, 408b depending on the applied electric field. Electric charge accumulated at vertical photogate 408a or vertical photogate 408b during the integration period is transferred to the associated storage diode 410a (SD_A) or storage diode 410b (SD_B), respectively. After integration and during readout, charge stored on the storage diodes 410a, 410b is transferred to a floating diffusion capacitor 412a, 412b, for each pixel tap via operation of a transfer gate 414a, 414b for each tap. Charge on each FD capacitor 412a, 412b is read as a voltage, thereby providing a signal for that pixel tap. In some examples, DTI regions 416 may be disposed between pixels.

Storage diodes 410a, 410b may comprise pinned diodes, as an example. The use of storage diodes as opposed to storage gates may provide various advantages. For example, while a storage gate offers wider voltage swing, the oxide interface of the storage gate also may contribute significant dark current, and thereby increase the noise floor. In contrast, a pinned diode may contribute less dark current, and thereby extend a dynamic range of the pixel tap on a lower signal end. Further, the use of a pinned diode does not utilize pulsing, as with a storage gate, and thus may reduce power consumption compared to the use of a storage gate.

Figure 5:
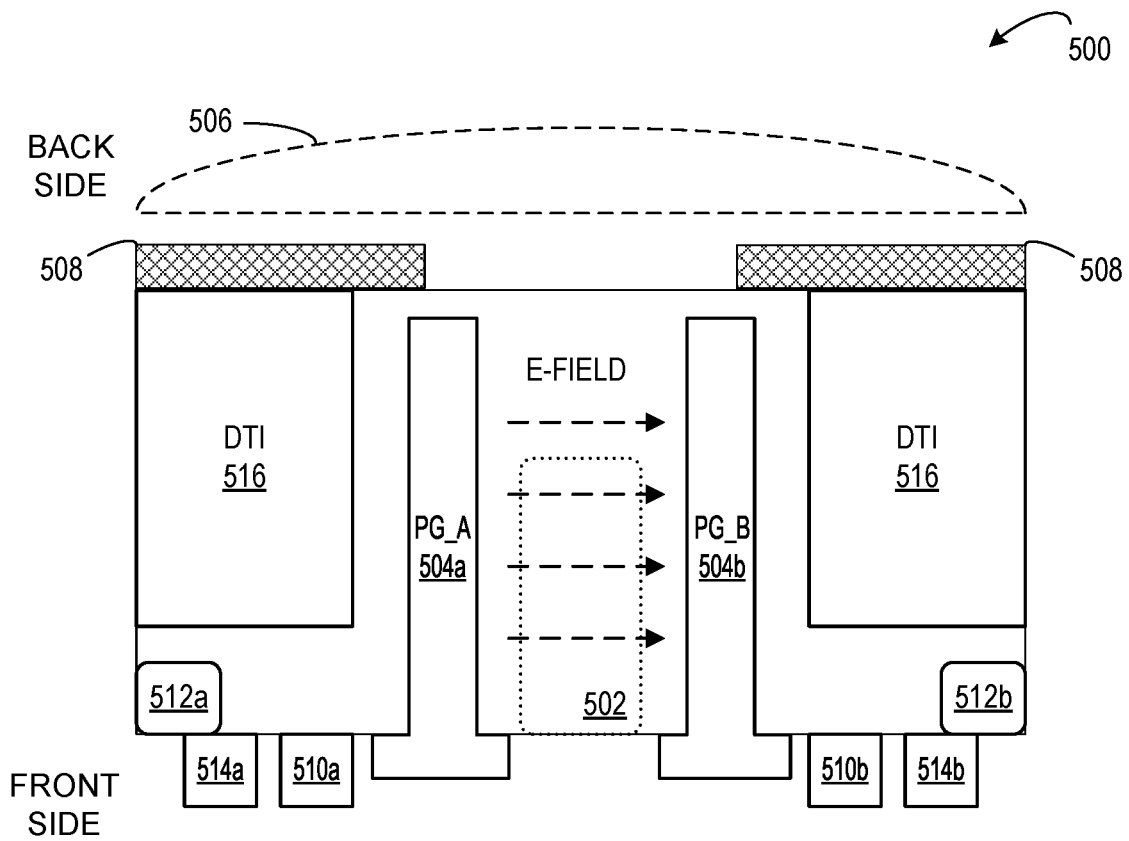
FIG. 5 shows a sectional view of an example ToF pixel comprising a germanium region for far infrared imaging.

FIG. 5 shows a cross sectional view of another example ToF pixel 500 configured for backside illumination. Pixel 500 is another example of an individually addressable pixel suitable for use as pixel 200 of FIG. 2. Pixel 500 is similar to pixel 300 in structure, but comprises a germanium region 502 disposed between vertical photogate 504a and vertical photogate 504b. The germanium region 502 may be used for imaging via a light source that emits FIR light. Light incident on the pixel is focused by a microlens 506 onto the pixel area to generate photoelectrons within the germanium region 502. A metal shield 508 or other suitable structure may be formed on the back side to allow light into the pixel area. Generated photoelectrons flow to either of the vertical photogates 504a, 504b depending on the applied electric field. Electric charge accumulated at vertical photogate 504a or vertical photogate 504b during the integration period is transferred to the associated storage gate 510a or storage gate 510b, respectively. After integration and during readout, charge stored on the storage gates 510a, 510b is transferred to a floating diffusion capacitor 512a, 512b, for each pixel tap via operation of a transfer gate 514a, 514b for each tap. Charge on each FD capacitor 512a, 512b is read as a voltage, thereby providing a signal for that pixel tap. Further, DTI regions 516 may be disposed between pixels.

Figure 6:
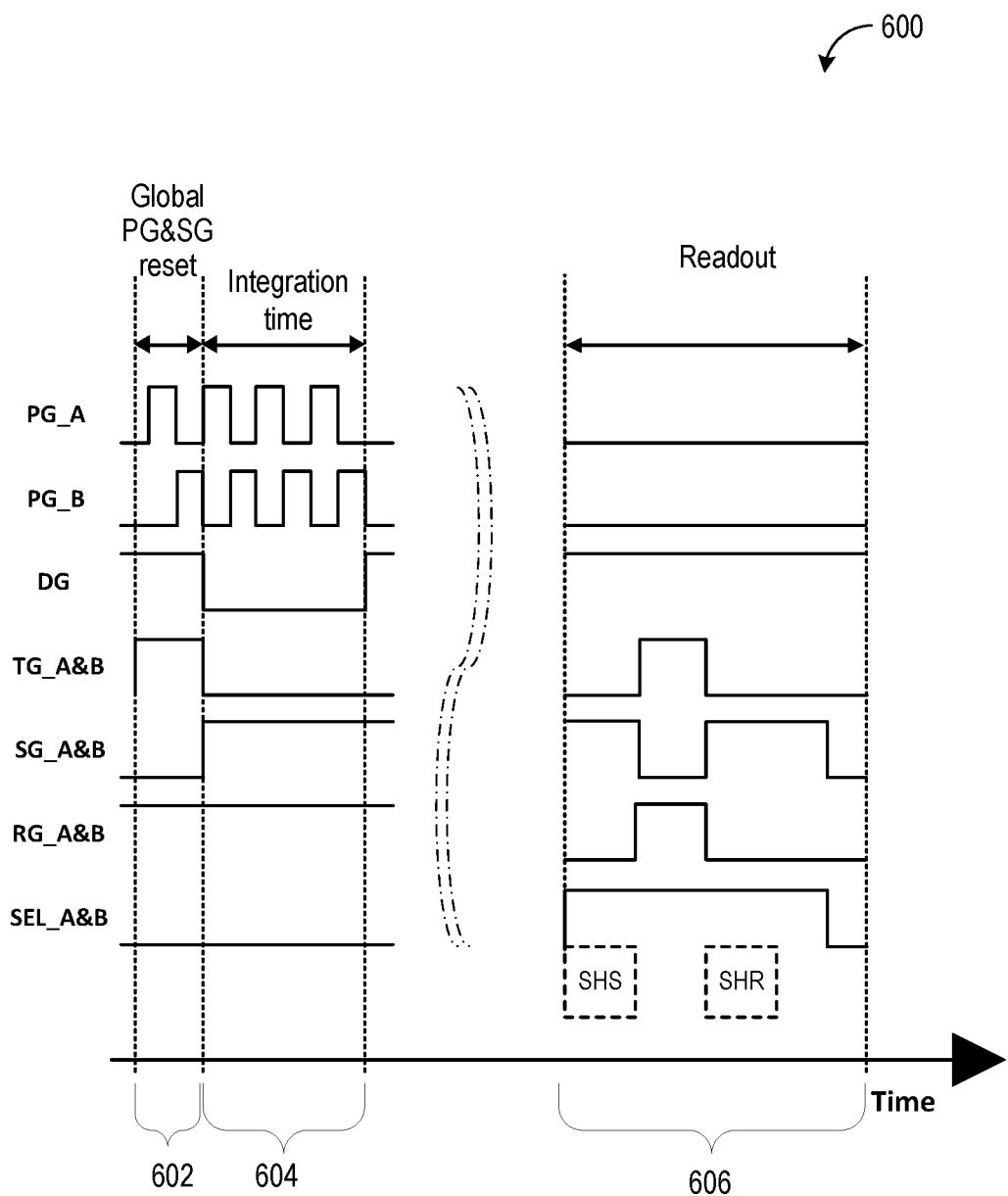
FIG. 6 shows an example timing diagram for operating a ToF camera pixel.

FIG. 6 shows a detailed view of a timing diagram 600, illustrating the operation of a ToF pixel (or plurality of ToF pixels). Timing diagram 600 illustrates a reset stage 602, an integration stage 604, and a readout stage 606. During the integration stage 604, the drain gate (DG) and transfer gate (TG) is are held low, and vertical photogates PG_A and PG_B are modulated out of phase with each other. As described above, depending upon the relative bias between the photogates, photoelectrons are directed to one of vertical photogates PG_A and PG_B during each modulation cycle, thereby integrating charge at each tap. As mentioned above, in various examples, the voltages applied to each vertical photogate may modulate between ground and a non-zero voltage, or may modulate between positive and negative voltages. The use of a negative bias may result in hole accumulation at the photogate, and thereby help reduce dark current noise. In some examples, the biases applied to the photogates may be varied during use. For example, the bias voltage may be adjusted according to modulation frequency, as lower modulation frequencies may allow for the use of a lower bias voltage, which may provide for lower power consumption.

Next, in the readout stage 606, the photogates PG_A and PG_B are held low, the select gates SEL_A&B are held high and the drain gate DG is held high. Other gates are modulated to transfer charge to a floating diffusion (FD) capacitor for each tap. The resulting voltage across the FD capacitor is measured as the output signal for each tap. The storage gates SG_A&B are then modulated to low along with the select gates SEL_A&B, and then the next reset stage 602 begins.

Figure 7:
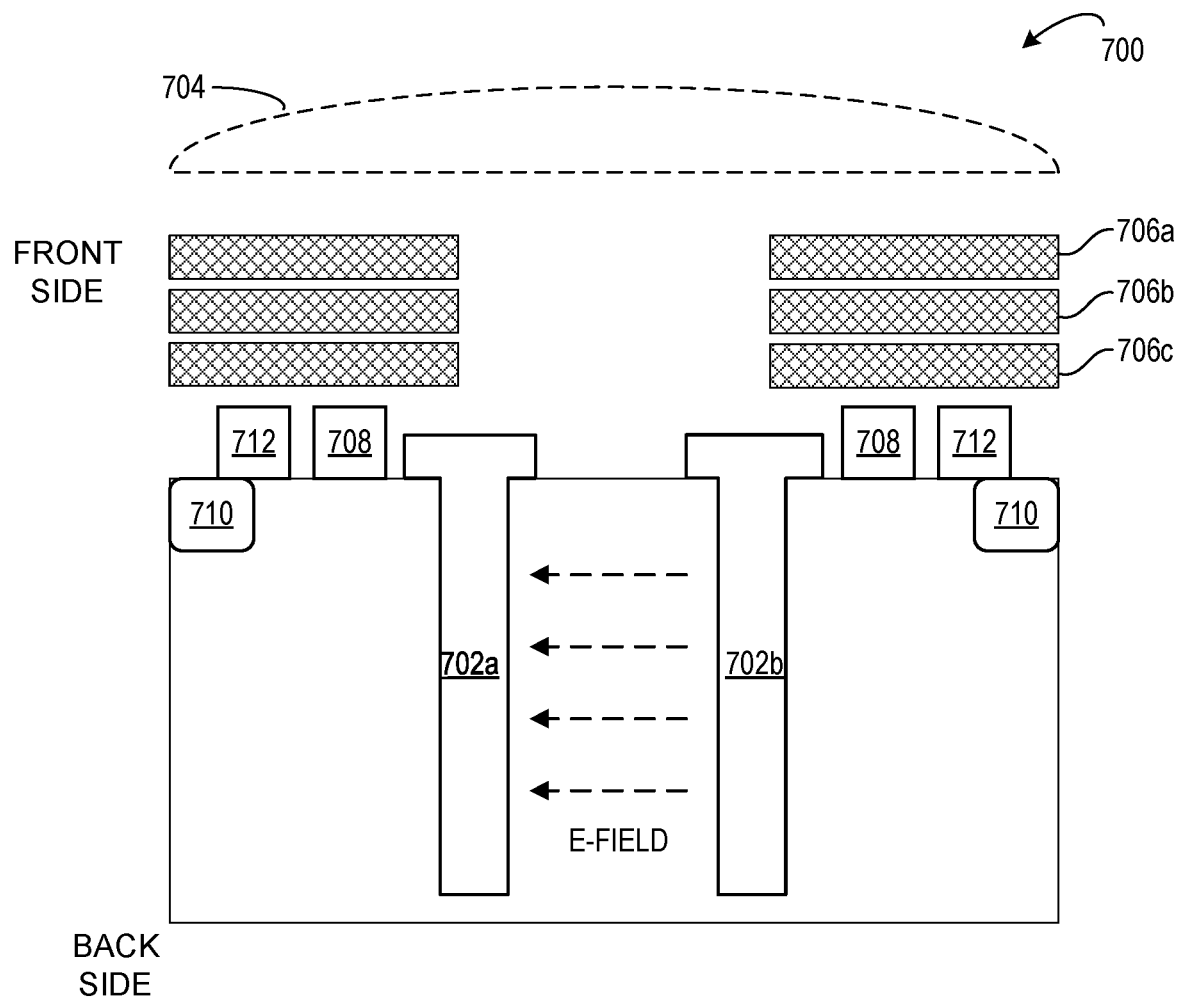
FIG. 7 shows an example ToF pixel configured for front-side illumination.

Each of the above-described example pixels 300, 400 and 500 are configured for backside illumination. In other examples, a pixel according to the present disclosure may be configured for frontside illumination. FIG. 7 shows an example ToF pixel 700 configured for front side illumination. Light incident on the pixel is focused by a microlens 704 onto the pixel area to generate photoelectrons within a photoelectron generation region between vertical photogates 702a, 702b. A multi-layer metal shield 706a, 706b, 706c or other suitable structure may be formed on the frontside to allow light into the pixel area while blocking light from entering adjacent regions. Generated photoelectrons may flow to either of the vertical photogates 702a, 702b depending on the applied electric field. Electric charge accumulated at vertical photogate 702a or photogate 702b during the integration period is transferred to the associated storage gate 708a or storage gate 708b, respectively. After integration and during readout, charge stored on the storage gates 708a, 708b is transferred to a FD capacitor 710a, 710b, for each pixel tap via operation of a transfer gate 712a, 712b for each tap. Charge on each FD capacitor 710a, 710b is read as a voltage, thereby providing a signal for that pixel tap.

Figure 8:
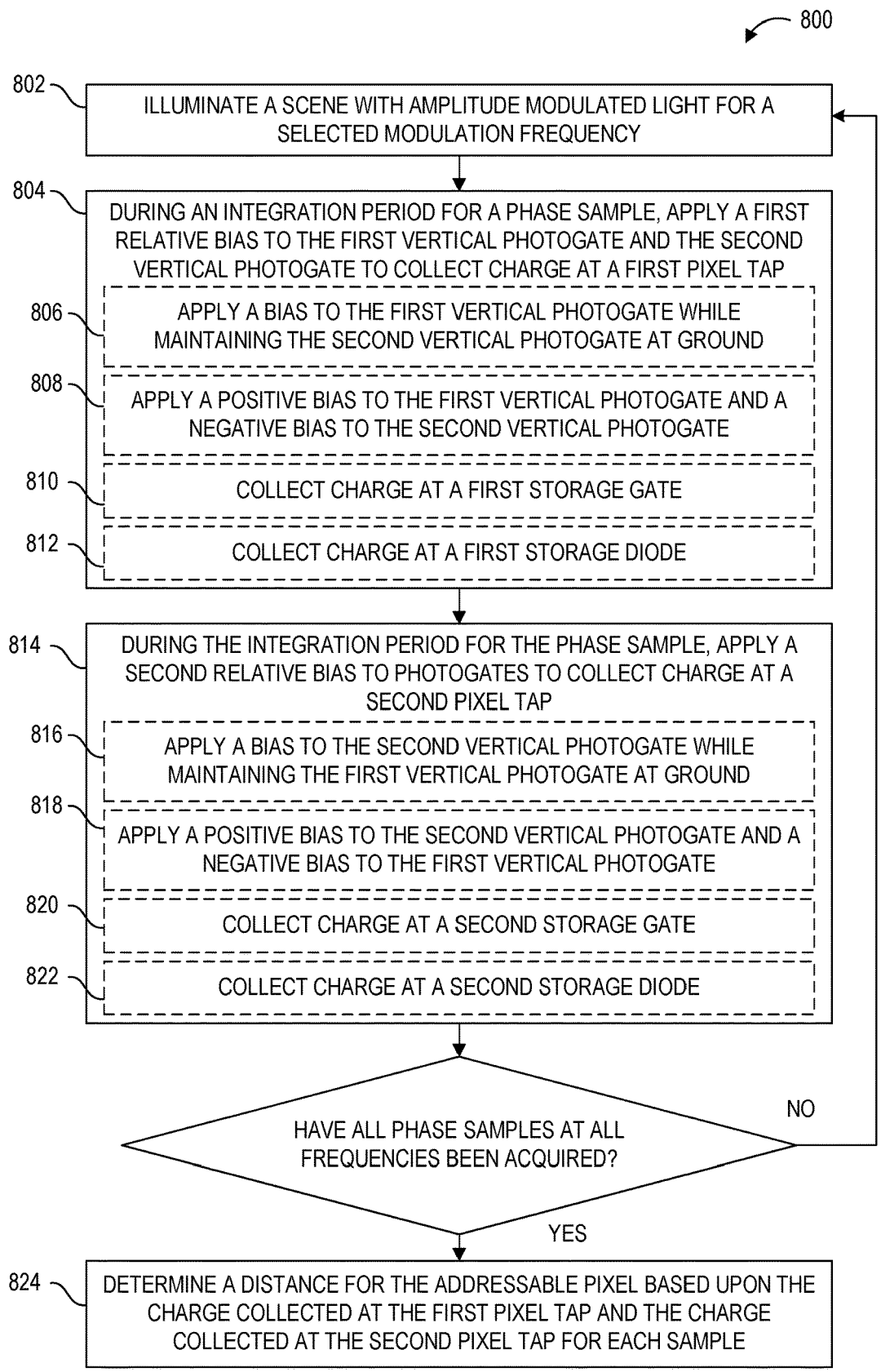
FIG. 8 is a flow diagram depicting an example method for determining a distance value for a time-of-flight pixel.

FIG. 8 is a flow diagram depicting an example method 800 for determining a distance value for an addressable pixel. Measuring a distance value at a pixel generally utilizes multiple samples acquired at different phases of the amplitude-modulated illumination light. Further, to increase an unambiguous distance range, the illumination light may be modulated at a plurality of different frequencies. In one non-limiting example, three different phase samples may be acquired at each of three different illumination modulation frequencies.

Method 800 comprises, at 802, illuminating a scene with amplitude modulated light at a selected modulation frequency. Any suitable wavelength of light may be used, including but not limited to NIR and FIR wavelengths. Method 800 further comprises, at 804, during an integration period for a selected phase sample, applying a first relative bias to a first vertical photogate and a second vertical photogate to collect charge at a first pixel tap. In some examples, method 800 may comprise, at 806, applying a positive bias to the first vertical photogate while maintaining the second vertical photogate at ground. In other examples, method 800 may comprise, at 808, applying a positive bias to the first vertical photogate and a negative bias to the second vertical photogate. In some examples, the integrated charge may be collected at a first storage gate at 810, while in other examples the charge may be collected at a first storage diode at 812.

Continuing, method 800 further comprises, at 814, during the integration period for the selected phase sample, applying a second relative bias to the first vertical photogate and the second vertical photogate to collect charge at a second pixel tap. In some examples, method 800 may comprises, at 816, applying a positive bias to the second vertical photogate while maintaining the first vertical photogate at ground. In other examples, method 800 may comprise, at 818, applying a positive bias to the second vertical photogate and a negative bias to the first vertical photogate. In some examples, method 800 comprises, at 820, collecting charge at a second storage gate, while in other examples, method 800 comprises, at 822, collecting charge at a second storage diode.

Where additional samples are to be acquired, as indicated at 824, method 800 returns to 802 for the next phase sample. Once all phase samples at all illumination modulation frequencies have been acquired, method 800 comprises, at 826, determining a distance value for the addressable pixel based upon the charges collected at the first pixel tap and the second pixel tap for each of the samples.

In some embodiments, the methods and processes described herein may be tied to a computing system of one or more computing devices. In particular, such methods and processes may be implemented as a computer-application program or service, an application-programming interface (API), a library, and/or other computer-program product.

Figure 9:
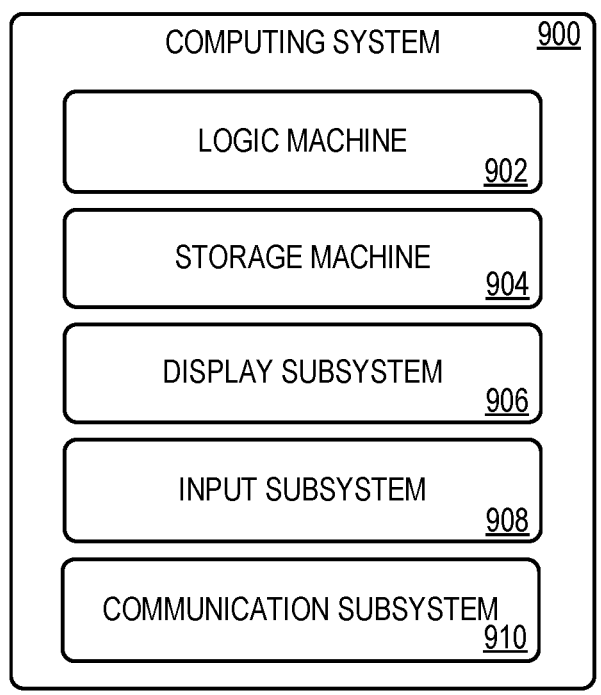
FIG. 9 is a block diagram of an example computing system.

FIG. 9 schematically shows a non-limiting embodiment of a computing system 900 that can enact one or more of the methods and processes described above. Computing system 900 is shown in simplified form. Computing system 900 may take the form of one or more personal computers, server computers, tablet computers, home-entertainment computers, network computing devices, gaming devices, mobile computing devices, mobile communication devices (e.g., smart phone), and/or other computing devices. In some examples, computing system 900 may generally represent a ToF camera, such as ToF camera 100 or a computing device incorporating a ToF camera.

Computing system 900 includes a logic machine 902 and a storage machine 904. Computing system 900 may optionally include a display subsystem 906, input subsystem 908, communication subsystem 910, and/or other components not shown in FIG. 9.

Logic machine 902 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 904 includes one or more physical devices configured to hold instructions executable by the logic machine to implement the methods and processes described herein. When such methods and processes are implemented, the state of storage machine 904 may be transformed—e.g., to hold different data.

Storage machine 904 may include removable and/or built-in devices. Storage machine 904 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 904 may include volatile, nonvolatile, dynamic, static, read/write, read-only, random-access, sequential-access, location-addressable, file-addressable, and/or content-addressable devices.

It will be appreciated that storage machine 904 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 902 and storage machine 904 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 906 may be used to present a visual representation of data held by storage machine 904. This visual representation may take the form of a graphical user interface (GUI). As the herein described methods and processes change the data held by the storage machine, and thus transform the state of the storage machine, the state of display subsystem 906 may likewise be transformed to visually represent changes in the underlying data. Display subsystem 906 may include one or more display devices utilizing virtually any type of technology. Such display devices may be combined with logic machine 902 and/or storage machine 904 in a shared enclosure, or such display devices may be peripheral display devices.

When included, input subsystem 908 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition (e.g. depth camera 100); a head tracker, eye tracker, accelerometer, and/or gyroscope for motion detection and/or intent recognition; as well as electric-field sensing componentry for assessing brain activity.

When included, communication subsystem 910 may be configured to communicatively couple computing system 900 with one or more other computing devices. Communication subsystem 910 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 900 to send and/or receive messages to and/or from other devices via a network such as the Internet.

Another example provides a time-of-flight (ToF) camera comprising an image sensor comprising a plurality of addressable pixels configured for backside illumination, each addressable pixel comprising a first vertical photogate and a second vertical photogate spaced from the first vertical photogate; a processor; and a storage device storing instructions executable by the processor to, for each addressable pixel, during an integration period, apply a first relative bias to the first vertical photogate and the second vertical photogate to collect charge at a first pixel tap, during the integration period, apply a second relative bias to the first vertical photogate and the second vertical photogate to collect charge at a second pixel tap, and determine a distance value for the addressable pixel based at least upon the charge collected at the first pixel tap and charge collected at the second pixel tap. The first pixel tap and the second pixel tap may additionally or alternatively each comprise a storage gate. The first pixel tap and the second pixel tap may additionally or alternatively each comprise a storage diode. The vertical photogates may additionally or alternatively have a length that is between 70% and 95% of a thickness of a photoelectron generation region of the addressable pixel. The first vertical photogate and the second vertical photogate may additionally or alternatively be separated by a distance less than a thickness of a photoelectron generation region of the addressable pixel. Each addressable pixel may additionally or alternatively comprise a region of germanium. Applying a first relative bias may additionally or alternatively comprise applying a bias to the first vertical photogate while maintaining the second vertical photogate at ground. Applying a first relative bias may additionally or alternatively comprise applying a positive bias to the first vertical photogate and a negative bias to the second vertical photogate. The addressable pixels of the ToF camera may additionally or alternatively comprise a pitch of 1 µm to 3 µm.

Another example provides a method for determining a distance value for an addressable pixel of a ToF camera, the addressable pixel comprising a first vertical photogate and a second vertical photogate spaced from the first vertical photogate, the method comprising illuminating a scene with amplitude modulated light; during an integration period, applying a positive bias to the first vertical photogate and a negative bias to the second vertical photogate to collect charge at a first pixel tap; during the integration period, applying a negative bias to the first vertical photogate and a positive bias to the second vertical photogate to collect charge at a second pixel tap; and determining a distance value for the addressable pixel based at least upon the charge collected at the first pixel tap and the charge collected at the second pixel tap. Collecting charge at the first pixel tap and collecting charge at the second pixel tap may additionally or alternatively comprise collecting charge from a germanium region. Collecting charge at the first pixel tap and collecting charge at the second pixel tap may additionally or alternatively comprise collecting charge from an epitaxial silicon region. Collecting charge at a first pixel tap may additionally or alternatively comprise collecting charge at a first storage gate and collecting charge at a second pixel tap may additionally or alternatively comprise collecting charge at a second storage gate. Collecting charge at a first pixel tap may additionally or alternatively comprise collecting charge at a first storage diode and collecting charge at a second pixel tap may additionally or alternatively comprise collecting charge at a second storage diode.

Another example provides a computing device, comprising a light source configured to illuminate a scene by emitting amplitude-modulated light; an image sensor comprising plurality of addressable pixels, each addressable pixel comprising a first vertical photogate and a second vertical photogate, each of the first vertical photogate and the second vertical photogate comprising a length that is between 70% and 95% of a thickness of a photoelectron generation region of the addressable pixel; a processor; and a storage device comprising instructions executable on the processor to control the light source to emit amplitude-modulated light, for each phase sample of a plurality of phase samples, modulate a bias applied between first vertical photogate and the second vertical photogate to integrate charge at a first pixel tap and a second pixel tap of the addressable pixels, for each addressable pixel, determine a distance value for the addressable pixel based at least upon the charge integrated at the first pixel tap and the second pixel tap for each phase sample, and, based on the distance value for each addressable pixel, output a depth image of the scene. The photoelectron generation region of each addressable pixel may additionally or alternatively comprise a germanium region. Each addressable pixel may additionally or alternatively comprise a storage gate. Each addressable pixel may additionally or alternatively comprise a storage diode. Modulating the bias may additionally or alternatively comprise applying ground to the first vertical photogate and applying a nonzero voltage to the second vertical photogate. Modulating the bias may additionally or alternatively comprise applying a positive voltage to the first vertical photogate and a negative voltage to the second vertical photogate.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A time-of-flight (ToF) camera comprising:
an image sensor comprising a plurality of addressable pixels configured for backside illumination, each addressable pixel comprising a photoelectron generation region, a first vertical photogate, and a second vertical photogate spaced apart from the first vertical photogate with the photoelectron generation region therebetween such that photoelectrons are generated between the first vertical photogate and the second vertical photogate during operation of the addressable pixel, wherein the first vertical photogate and the second vertical photogate are separated by a distance less than a thickness of the photoelectron generation region of the addressable pixel;
a processor; and
a storage device storing instructions executable by the processor to, for each addressable pixel
during an integration period, apply a first relative bias to the first vertical photogate and the second vertical photogate to collect charge at a first pixel tap, during the integration period, apply a second relative bias to the first vertical photogate and the second vertical photogate to collect charge at a second pixel tap, and determine a distance value for the addressable pixel based at least upon the charge collected at the first pixel tap and charge collected at the second pixel tap.

2. The ToF camera of claim 1, wherein the first pixel tap and the second pixel tap each comprises a storage gate.

3. The ToF camera of claim 1, wherein the first pixel tap and the second pixel tap each comprises a storage diode.

4. The ToF camera of claim 1, wherein the vertical photogates have a length that is between 50% and 95% of the thickness of the photoelectron generation region of the addressable pixel.

5. The ToF camera of claim 1, wherein the photoelectron generation region comprises a region of germanium.

6. The ToF camera of claim 1, wherein applying a first relative bias comprises applying a bias to the first vertical photogate while maintaining the second vertical photogate at ground.

7. The ToF camera of claim 1, wherein applying a first relative bias comprises applying a positive bias to the first vertical photogate and a negative bias to the second vertical photogate.

8. The ToF camera of claim 1, wherein the addressable pixels comprise a pitch of 1 mm to 3 mm.

9. A method for determining a distance value for an addressable pixel of an image sensor of a ToF camera, the addressable pixel comprising a first vertical photogate and a second vertical photogate spaced from the first vertical photogate, the addressable pixel further comprising a photoelectron generation region disposed between the first vertical photogate and the second vertical photogate, wherein the first vertical photogate and the second vertical photogate are separated by a distance less than a thickness of the photoelectron generation region of the addressable pixel, the method comprising:

illuminating a scene with amplitude modulated light;
generating photoelectrons in the photoelectron generation region between the first vertical photogate and the second vertical photogate from light reflected from the scene;
during an integration period, applying a positive bias to the first vertical photogate and a negative bias to the second vertical photogate to collect charge at a first pixel tap from photoelectrons generated in the photoelectron generation region;
during the integration period, applying a negative bias to the first vertical photogate and a positive bias to the second vertical photogate to collect charge at a second pixel tap from photoelectrons generated in the photoelectron generation region; and
determining a distance value for the addressable pixel based at least upon the charge collected at the first pixel tap and the charge collected at the second pixel tap.

10. The method of claim 9, wherein collecting charge at the first pixel tap and collecting charge at the second pixel tap comprises collecting charge from a germanium region.

11. The method of claim 9, wherein collecting charge at the first pixel tap and collecting charge at the second pixel tap comprises collecting charge from an epitaxial silicon photoelectron generation region.

12. The method of claim 9, wherein collecting charge at a first pixel tap comprises collecting charge at a first storage gate and wherein collecting charge at a second pixel tap comprises collecting charge at a second storage gate.

13. The method of claim 9, wherein collecting charge at a first pixel tap comprises collecting charge at a first storage diode and wherein collecting charge at a second pixel tap comprises collecting charge at a second storage diode.

14. A computing device, comprising:
a light source configured to illuminate a scene by emitting amplitude-modulated light;
an image sensor comprising plurality of addressable pixels, each addressable pixel comprising a first vertical photogate and a second vertical photogate, each addressable pixel further comprising a photoelectron generation region disposed between the first vertical photogate and the second vertical photogate such that photoelectrons are generated between the first vertical photogate and the second vertical photogate during operation of the addressable pixel, the first vertical photogate separated from the second vertical photogate by a distance less than a thickness of the photoelectron generation region of the addressable pixel, each of the first vertical photogate and the second vertical photogate comprising a length that is between 70% and 95% of the thickness of the photoelectron generation region of the addressable pixel;
a processor; and
a storage device comprising instructions executable on the processor to
control the light source to emit amplitude-modulated light,
for each phase sample of a plurality of phase samples, modulate a bias applied between first vertical photogate and the second vertical photogate to integrate charge at a first pixel tap and a second pixel tap of the addressable pixels,
for each addressable pixel, determine a distance value for the addressable pixel based at least upon the charge integrated at the first pixel tap and the second pixel tap for each phase sample, and
based on the distance value for each addressable pixel, output a depth image of the scene.

15. The computing device of claim 14, wherein the photoelectron generation region of each addressable pixel comprises a germanium region.

16. The computing device of claim 14, wherein each addressable pixel further comprises a storage gate.

17. The computing device of claim 14, wherein each addressable pixel further comprises a storage diode.

18. The computing device of claim 14, wherein modulating the bias comprises applying ground to the first vertical photogate and applying a nonzero voltage to the second vertical photogate.

19. The computing device of claim 14, wherein modulating the bias comprises applying a positive voltage to the first vertical photogate and a negative voltage to the second vertical photogate.

* * * * *